(12) United States Patent
Song et al.

(10) Patent No.: US 9,799,844 B2
(45) Date of Patent: Oct. 24, 2017

(54) ORGANIC LIGHT EMITTING ELEMENT

(71) Applicant: LG DISPLAY CO., LTD., Seoul (KR)

(72) Inventors: Jae Il Song, Paju-si (KR); Jeong Haeng Heo, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/308,209

(22) Filed: Jun. 18, 2014

(65) Prior Publication Data
US 2015/0060793 A1   Mar. 5, 2015

(30) Foreign Application Priority Data

Aug. 30, 2013 (KR) .......................... 10-2013-0104134

(51) Int. Cl.
*H01L 51/50* (2006.01)

(52) U.S. Cl.
CPC ...... *H01L 51/5044* (2013.01); *H01L 51/5004* (2013.01)

(58) Field of Classification Search
None
See application file for complete search history.

(56) References Cited

U.S. PATENT DOCUMENTS

| | | | |
|---|---|---|---|
| 2005/0173700 A1* | 8/2005 | Liao et al. | 257/40 |
| 2006/0088729 A1 | 4/2006 | Begley et al. | |
| 2008/0121818 A1* | 5/2008 | Agrawal | C09K 11/08 250/486.1 |
| 2009/0230415 A1* | 9/2009 | Ide et al. | 257/98 |
| 2010/0289417 A1* | 11/2010 | Fujita et al. | 315/209 R |
| 2012/0241725 A1* | 9/2012 | Sawabe | H01L 51/5004 257/40 |

FOREIGN PATENT DOCUMENTS

| | | |
|---|---|---|
| CN | 1703937 A | 11/2005 |
| CN | 102694127 A | 9/2012 |

OTHER PUBLICATIONS

Seo et al., "Color Tuning of White Organic Light-Emitting Diodes by Adjusting the Device Structure", Journal of the Korean Physical Society, vol. 51, Dec. 2007, pp. S289-S292.*
Li et al., "Organic Light-Emitting Materials and Devices", CRC Press, Sep. 12, 2006, p. 335.*
Kim et al., "High efficiency phosphorescent organic light-emitting diodes using carbazole-type triplet exciton blocking layer", Appl. Phys. Lett. 90, 223505, http://dx.doi.org/10.1063/1.2742788 (2007).*

(Continued)

*Primary Examiner* — Fazli Erdem
*Assistant Examiner* — Scott R Wilson
(74) *Attorney, Agent, or Firm* — Dentons US LLP

(57) ABSTRACT

An organic light emitting element is disclosed which includes: an anode and a cathode formed on a substrate and disposed to face each other; and a stack formed between the anode and the cathode and configured to include a hole transport layer, a first light emission layer, a second emission layer and an electron transport layer. The first light emission layer adjacent to the anode includes a host with band gaps of 1.00 eV~2.70 eV and 2.76 eV~4.00 eV. Such an organic light emitting element allows at least two light emission layers to be included into a single stack so that a driving voltage is reduced.

11 Claims, 4 Drawing Sheets

(56) References Cited

OTHER PUBLICATIONS http://halas.rice.edu/conversions 2017.*
Park, et al.: "Energy transfer from exciplexes to dopants and its effect on efficiency of organic light-emitting diodes", Journal of Applied Physics, vol. 110, Dec. 30, 2011.
Se-gang, OH : "Introduction to organic electromagnetism", Beijing: Chemical Industry Press, Jan. 31, 2010, pp. 126-134.

* cited by examiner

ORGANIC LIGHT EMITTING ELEMENT

The present application claims priority under 35 U.S.C. §119(a) of Korean Patent Application No. 10-2013-0104134 filed on Aug. 30, 2013 which is hereby incorporated by reference in its entirety for all purposes as if fully set forth herein.

BACKGROUND OF THE INVENTION

Field of the Disclosure

The present application relates to an organic light emitting element. More particularly, the present application relates to an organic light emitting element adapted to enhance luminous efficiency in a structure including at least two organic light emission layers.

Description of the Related Art

The display field for visually representing an electrical information signal has been rapidly developed with the spread of substantial information society. In accordance therewith, a variety of flat panel display devices with features, such as slimness, light weight and low power consumption have been developed. Also, the flat panel display devices have been rapidly replacing the existing cathode ray tubes (CRTs).

As examples of the flat panel display devices, liquid crystal display (LCD) devices, organic light emitting display (OLED) devices, electrophoretic display (electric paper display (EPD)) devices, plasma display panel device (PDPs), field emission display (FED) devices, electroluminescence display devices (ELDs), elector-wetting display (EWD) devices, and so on can be introduced. Such flat panel display devices commonly include a flat display panel, which realize an image, as a necessary component. The flat display panel is configured with a pair of combined substrates which face each other with having an inherent light emitting or polarizing material layer therebetween.

The organic light emitting display device corresponding to one of the flat panel display devices includes an organic light emitting element which is a self-illuminating element. As such, the organic light emitting display devices do not need a separate light source which is used in a liquid crystal display device. In accordance therewith, organic light emitting display devices are lighter and thinner. Also, organic light emitting display devices have features of wider viewing angle, superior contrast, and lower power consumption than those of the liquid crystal display devices. Moreover, organic light emitting display devices can be driven by a low direct-current voltage and provide a high speed response. Furthermore, organic light emitting display devices can resist external impacts and be used in a wide temperature range because of having solid components.

The organic light emitting element applies an electric field to an organic light emission layer and forces the organic light emission layer to emit light. The organic light emission layer is formed from an organic material and on a glass substrate in such a manner as to be disposed between an anode and a cathode. The anode is formed from ITO (indium-tin-oxide) or others, and the cathode is formed from aluminum or others. In detail, if a voltage is applied between the anode and the cathode of the organic light emitting element, electric-holes injected from the anode and electrons injected from the cathode move toward the organic light emission layer and are recombined with each other in the organic light emission layer, thereby forming excitons. Light can be emitted by which the excitons are transitioned from an excited state to a ground state.

Such an organic light emitting display device can be fabricated in a single stack structure or a multi-stack structure including a plurality of stacked organic light emitting elements. The multi-stack structure can provide a high efficiency when white organic light emitting elements are included. However, as the number of stacks increases, a driving voltage must be increased.

Alternatively, a structure of including a plurality of light emission layers within a single stack can be applied to the organic light emitting display device. In this case, light emitted in a light emission layer adjacent to the cathode which is used to inject the electrons must be absorbed into another light emission layer adjacent to the anode which is used to inject the electric-holes. More specifically, in order to enhance luminous efficiency, each of the light emission layers includes a host. The host of a light emission layer adjacent to the anode absorbs light emitted from another light emission layer adjacent to the cathode. Due to this, an external luminous efficiency of the light emission layer adjacent to the cathode must deteriorate.

SUMMARY OF THE INVENTION

Accordingly, embodiments of the present application are directed to an organic light emitting element that substantially obviates one or more problems due to the limitations and disadvantages of the related art.

The embodiments provide an organic light emitting element adapted to enhance luminous efficiency and reduce a driving voltage in a structure of including first and second light emission layers.

Also, the embodiments provide an organic light emitting element which is adapted to enhance luminous efficiency of a light emission layer adjacent to a cathode through an improvement of a host of another light emission layer adjacent to an anode.

Moreover, the embodiments provide an organic light emitting element which is adapted to enhance external luminous efficiency in a structure with first and second light emission layers which are included into a single stack.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to a general aspect of the present embodiment for solving the above-mentioned problems, an organic light emitting element includes: an anode and a cathode formed on a substrate and disposed to face each other; and a stack formed between the anode and the cathode and arranged to include a hole transport layer, a first light emission layer, a second emission layer and an electron transport layer. The first light emission layer adjacent to the anode includes a host with band gaps of 1.00 eV~2.70 eV and 2.76 eV~4.00 eV.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiment(s) of the present disclosure and together with the description serve to explain the disclosure. In the drawings.

DETAILED DESCRIPTION OF THE ILLUSTRATED EMBODIMENTS

Figure 1:
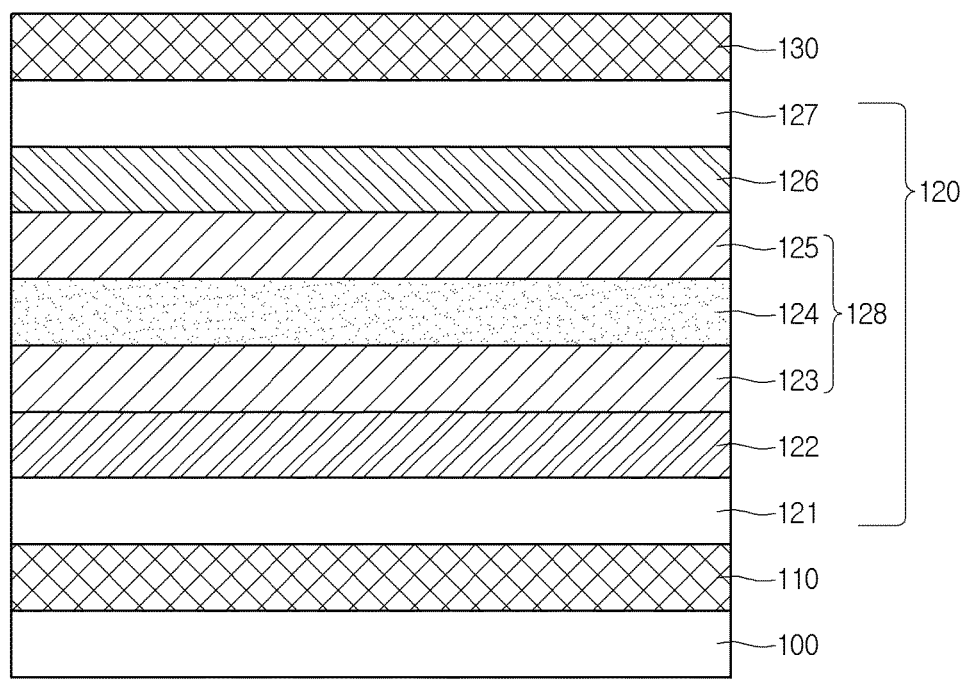
FIG. 1 is a cross-sectional view showing an organic light emitting element according to a first embodiment of the present disclosure.

Reference will now be made in detail to embodiments of the present disclosure, examples of which are illustrated in the accompanying drawings. The embodiments introduced hereinafter are provided as examples in order to convey their spirits to the ordinary skilled person in the art. Therefore, these embodiments might be embodied in a different shape, so are not limited to these embodiments described here. In the drawings, the size, thickness and so on of a device can be exaggerated for convenience of explanation. Wherever possible, the same reference numbers will be used throughout this disclosure including the drawings to refer to the same or like parts.

FIG. 1 is a cross-sectional view showing an organic light emitting element according to a first embodiment of the present disclosure.

Referring to FIG. 1, the organic light emitting element according to a first embodiment of the present disclosure includes an anode 110 and a cathode 130 which is formed a substrate 100 in such a manner as to face each other. A single stack 120 is formed between the anode 110 and 130.

The substrate 100 can include a thin film transistor (not shown) formed on an insulation substrate. The insulation substrate can be formed from insulation glass, a metal material, a plastic material, polyimide or others. The thin film transistor can include: a gate electrode formed on the insulation substrate; a gate insulation film covering the gate electrode; a semiconductor layer formed on the gate insulation film opposite to the gate electrode and configured to form a channel; and source and drain electrodes facing each other with having the channel therebetween. The drain electrode of the thin film transistor formed on the substrate is electrically connected to the anode 110. Although it is shown in the drawing that the anode 110 comes in contact with the substrate 100, the cathode 130 can be formed in contact with the substrate 100.

The anode 110 can be formed from a transparent conductive material. For example, the anode 110 can be formed from one selected from a material group which includes ITO (indium-tin-oxide), IZO (indium-zinc-oxide) and ZnO (zinc oxide). Meanwhile, the cathode 130 can be formed from a metal material. For example, the cathode 130 can be formed from one selected from a low work function metal group which includes magnesium Mg, calcium Ca, aluminum Al, an aluminum alloy, silver Ag, a silver alloy, gold Au and a gold alloy.

The stack 120 disposed between the anode 110 and the cathode 130 includes a hole injection layer (HIL) 121, a hole transport layer (HTL) 122, a light emission portion 128, an electron transport layer (ETL) 126 and an electron injection layer (EIL) 127 which are sequentially stacked on the anode 110. The light emission portion 128 can be formed by stacking a first light emission layer (EML) 123, a light emission control layer (ECL) 124 and a second light emission layer (EML) 125.

The first light emission layer 123 is defined as a light emission layer adjacent to the anode 110, and the second light emission layer 125 is defined as another light emission layer adjacent to the cathode 130. Electric-holes injected from the anode 110 and electrons injected from the cathode 130 are drifted in opposite directions and are recombined with each other in the first and second light emission layers 123 and 125, thereby forming excitons. The excitons generated in the first and second light emission layers 123 and 125 are transitioned from an excited state to the ground state and emit light.

The first and second light emission layers 123 and 125 are easy to drift the electrons, but difficult to drift the electric-holes. The first light emission layer 123 adjacent to the anode 110 directly receives the electric-holes from the anode 110. As such, the first light emission layer 123 is easy to emit light. Meanwhile, the second light emission layer 125 must receive the electric-holes only through the first light emission layer 123 in order to emit light. In other words, the transmission of the electric-holes to the second light emission layer 125 through the first light emission layer 123 is not smooth. Due to this, the second light emission layer 125 is difficult to emit light. Therefore, an improvement is necessary for the transmission of the electric-holes.

The light emission control layer 124 is formed between the first and second light emission layers 123 and 125 in order to smoothly supply the electric-holes to the second light emission layer 125. In other words, the light emission control layer 124 is used to transport the electric-holes to the second light emission layer 125. As such, the light emission control layer 124 can be formed from a material suitable to be used as the hole transport layer (HTL) 122. In order to smoothly inject the electric-holes into the second light emission layer 125, the light emission control layer 124 is preferably formed from the same material as the hole transport layer (HTL) 122.

Lights generated in the first and second light emission layers 123 and 125 are radiated toward the anode 110. As such, most of light generated in the first light emission layer 123 can be immediately radiated through the anode 110. Meanwhile, light generated in the second light emission layer 125 must be radiated through the first light emission layer 123. When light generated in the second light emission layer 125 penetrates through the first light emission layer 123, a part of light with a fixed wavelength is absorbed by the first light emission layer 123. Due to this, light of below 80% generated in the second light emission layer 125 must be radiated to the exterior.

To address this matter, the organic light emitting element according to the present disclosure allows a host of the first light emission layer 123 to be controlled so that the first light emission layer 123 absorbs only light of below 20% generated in the second light emission layer 125. In accordance therewith, the first light emission layer 123 can be formed to have transmittance of at least 80% with respect to light generated in the second light emission layer 125.

The host of the first light emission layer 123 can include materials with band gaps of no more than 2.70 eV and not less than 2.76 eV. In detail, the host of the first light emission layer 123 can include materials with band gaps of 1.00 eV~2.76 eV and 2.76 eV~4.00 eV. When the host of the first light emission layer 123 is formed from materials with band gaps of no more than 2.70 eV and not less than 2.76 eV, the luminous efficiency of the second light emission layer 125 and the entire luminous efficiency of the organic light emitting element can be enhanced.

The first light emission layer 123 can be a phosphorescent light emission layer, and the second light emission layer 125 can be a fluorescent light emission layer. In detail, the first light emission layer 123 can be a red phosphorescent light emission layer, and the second light emission layer 125 can be a blue fluorescent light emission layer. In other words, a host of the phosphorescent light emission layer is formed from materials with band gaps of no more than 2.70 eV and not less than 2.76 eV, in order to enhance the luminous efficiency of the fluorescent light emission layer.

Figure 2:
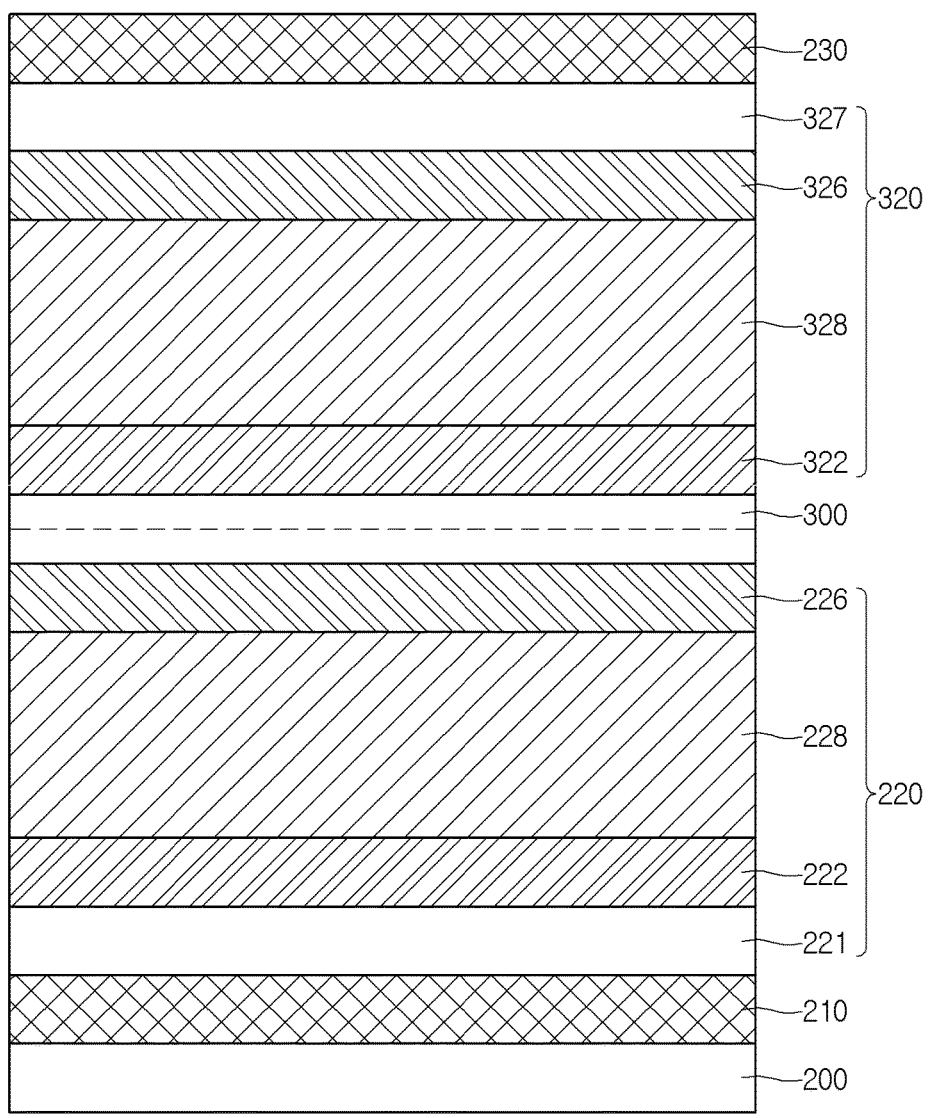
FIG. 2 is a cross-sectional view showing an organic light emitting element according to a second embodiment of the present disclosure.

FIG. 2 is a cross-sectional view showing an organic light emitting element according to a second embodiment of the present disclosure. The description of the second embodiment overlapping with the first embodiment will be omitted.

As shown in FIG. 2, the organic light emitting element according to the second embodiment of the present disclosure can be fabricated in a multi-stack structure. Although only first and second stacks 220 and 320 are shown in the drawing, the organic light emitting element can be fabricated in a structure which includes at least three stacks. In other words, the organic light emitting element according to the present disclosure can be fabricated in the structure including a plurality of stacks.

The organic light emitting element according to the second embodiment of the present disclosure includes an anode 210 and a cathode 230 which are formed on a substrate 200 in such a manner as to face each other. Also, the organic light emitting element includes a first stack 220, a charge generation layer (CGL) 300 and a second stack 320 which are stacked between the anode 210 and the cathode 230. The first stack 220, the charge generation layer (CGL) 300 and the second stack 320 are formed by being sequentially stacked on the anode 210.

The substrate 200 can include a thin film transistor (not shown) formed on an insulation substrate. The insulation substrate can be formed from insulation glass, a metal material, a plastic material, polyimide or others. The thin film transistor can include: a gate electrode formed on the insulation substrate; a gate insulation film covering the gate electrode; a semiconductor layer formed on the gate insulation film opposite to the gate electrode and configured to form a channel; and source and drain electrodes facing each other with having the channel therebetween. The drain electrode of the thin film transistor formed on the substrate 200 is electrically connected to the anode 210. Although it is shown in the drawing that the anode 210 comes in contact with the substrate 200, the cathode 230 can be formed in contact with the substrate 200.

The anode 210 can be formed from a transparent conductive material. For example, the anode 210 can be formed from one selected from a material group which includes ITO (indium-tin-oxide), IZO (indium-zinc-oxide) and ZnO (zinc oxide). Meanwhile, the cathode 230 can be formed from a metal material. For example, the cathode 230 can be formed from one selected from a low work function metal group which includes magnesium Mg, calcium Ca, aluminum Al, an aluminum alloy, silver Ag, a silver alloy, gold Au and a gold alloy.

The charge generation layer 300 formed between the first and second stacks 220 and 320 applies electrons to the first stack 220 and supplies electric-holes to the second stack 320, in order to control balance of charge between the first and second stacks 220 and 320. Such a charge generation layer 300 can become a thin metal layer which is formed from aluminum Al or others. Alternatively, the charge generation layer 300 can become a transparent electrode which is formed from ITO (indium-tin-oxide) or others. In other words, the charge generation layer 300 can be formed in a single layer. As such, the configuration of the organic light emitting element can be simplified and easily fabricated.

In other manner, the charge generation layer 300 can be formed in a junction structure which includes a plurality of organic layers formed by doping dopants. The charge generation layer 300 including the plurality of organic layers can smoothly transport the electrons and the electric-holes. As such, efficiency of the organic light emitting element can be enhanced and the life span of the organic light emitting element can be extended. More specifically, a surface portion of the charge generation layer 300 contacting the first stack 220 is doped with a dopant which smoothly applies the electrons, and the other surface portion of the charge generation layer 300 contacting the second stack 320 is doped with another dopant which smoothly applies the electric-holes. If at least three stacks are formed between the anode 210 and 230, the charge generation layer 300 can be formed between the stacks.

The first stack 220 is formed by sequentially stacking includes a hole injection layer 221, a first hole transport layer 222, a first light emission portion 228 and a first electron transport layer 226. The second stack 320, formed by sequentially stacking, includes a second hole transport layer 322, a second light emission portion 328, a second electron transport layer 326 and an electron injection layer 327 between the charge generation layer 300 and the cathode 230.

At least one of the first and second light emission portions 228 and 328 can be formed by stacking a first light emission layer, a light emission control layer and a second light emission layer. In other words, only one of the first and second light emission portions 228 and 328 can be formed in the stack structure of the first light emission layer, the light emission control layer and the second light emission layer, or both the first and second light emission portions 228 and 328 can be formed in the stack structure of the first light emission layer, the light emission control layer and the second light emission layer. If one of the first and second light emission portions 228 and 328 is formed the stack structure of the first light emission layer, the light emission control layer and the second light emission layer, the other can be formed to have a single light emission layer.

Also, if the organic light emitting element is fabricated in a multi-stack structure including at least three stacks, at least one stack can include a light emission portion which is formed in the stack structure of the first light emission layer, the light emission control layer and the second light emission layer. The light emission portion formed by stacking the first light emission layer, the light emission control layer and the second light emission layer will now be described in detail referring to the accompanying drawing.

Figure 3:
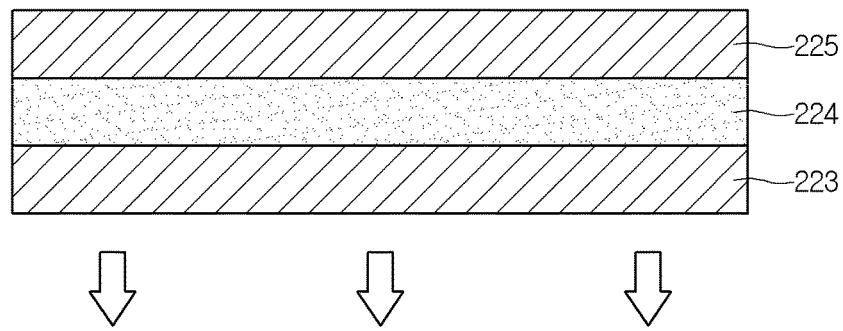
FIG. 3 is a cross-sectional view showing a light emission portion of an organic light emitting element according to a second embodiment of the present disclosure.

FIG. 3 is a cross-sectional view showing a light emission portion of an organic light emitting element according to a second embodiment of the present disclosure.

Referring to FIG. 3, the organic light emitting element including a plurality of stacks according to the present disclosure can include at least one light emission portion. The light emission portion is formed to have a structure in which a first light emission layer 223, a light emission control layer 224 and a second light emission layer 225 are stacked. With exception of at least one of the stacks including the light emission portion, the others can include a light emission layer which is formed in a single layer.

The first light emission layer 223 is defined as a light emission layer adjacent to the anode, and the second light emission layer 225 is defined as another light emission layer adjacent to the cathode. Electric-holes injected from the anode and electrons injected from the cathode are drifted in opposite directions and are recombined with each other in the first and second light emission layers 223 and 225, thereby forming excitons. The excitons generated in the first and second light emission layers 123 and 125 are transitioned from an excited state to the ground state and emit light. The first light emission layer 223 can be formed in contact with a hole transport layer, and the second light emission layer 225 can be formed in contact with an electron transport layer.

The first and second light emission layers 223 and 225 are easy to drift the electrons, but difficult to drift the electric-holes. Moreover, the second light emission layer 225 must receive the electric-holes through the first light emission layer 223 in order to emit light. As such, the transmission of the electric-holes to the second light emission layer 225 through the first light emission layer 223 is not smooth. Due to this, the second light emission layer 125 is difficult to emit light.

In order to smoothly supply the electric-holes to the second light emission layer 225, the light emission control layer 224 is formed between the first and second light emission layers 223 and 225. In other words, the light emission control layer 224 is used to transport the electric-holes to the second light emission layer 225. As such, the light emission control layer 224 can be formed from a material suitable to be used in the hole transport layer (HTL). Preferably, the light emission control layer 124 can be formed from the same material as the hole transport layer.

Lights generated in the first and second light emission layers 223 and 225 are radiated toward the anode. Light generated in the second light emission layer 225 must be radiated through the first light emission layer 223. As such, when light generated in the second light emission layer 225 penetrates through the first light emission layer 223, a part of light with a fixed wavelength is absorbed by the first light emission layer 223. Due to this, light of below 80% generated in the second light emission layer 225 must be radiated to the exterior.

To address this matter, the organic light emitting element according to the present disclosure allows a host of the first light emission layer 223 to absorb only light of below 20% generated in the second light emission layer 225. In accordance therewith, the first light emission layer 223 can be formed to have transmittance of at least 80% with respect to light generated in the second light emission layer 225.

The host of the first light emission layer 223 can include materials with band gaps of no more than 2.70 eV and not less than 2.76 eV. In detail, the host of the first light emission layer 223 can include materials with band gaps of 1.00 eV~2.70 eV and 2.76 eV~4.00 eV. When the host of the first light emission layer 223 is formed from the materials with the band gaps of no more than 2.70 eV and not less than 2.76 eV, the luminous efficiency of the second light emission layer 225 and the entire luminous efficiency of the organic light emitting element can be enhanced.

The first light emission layer 223 can be a phosphorescent light emission layer, and the second light emission layer 225 can be a fluorescent light emission layer. In detail, the first light emission layer 223 can be a red phosphorescent light emission layer, and the second light emission layer 225 can be a blue fluorescent light emission layer. In other words, a host of the phosphorescent light emission layer is formed from materials with the band gaps of no more than 2.70 eV and not less than 2.76 eV, in order to enhance the luminous efficiency of the fluorescent light emission layer. Effects of the first light emission layer 223 will now be described in detail.

Figure 4:
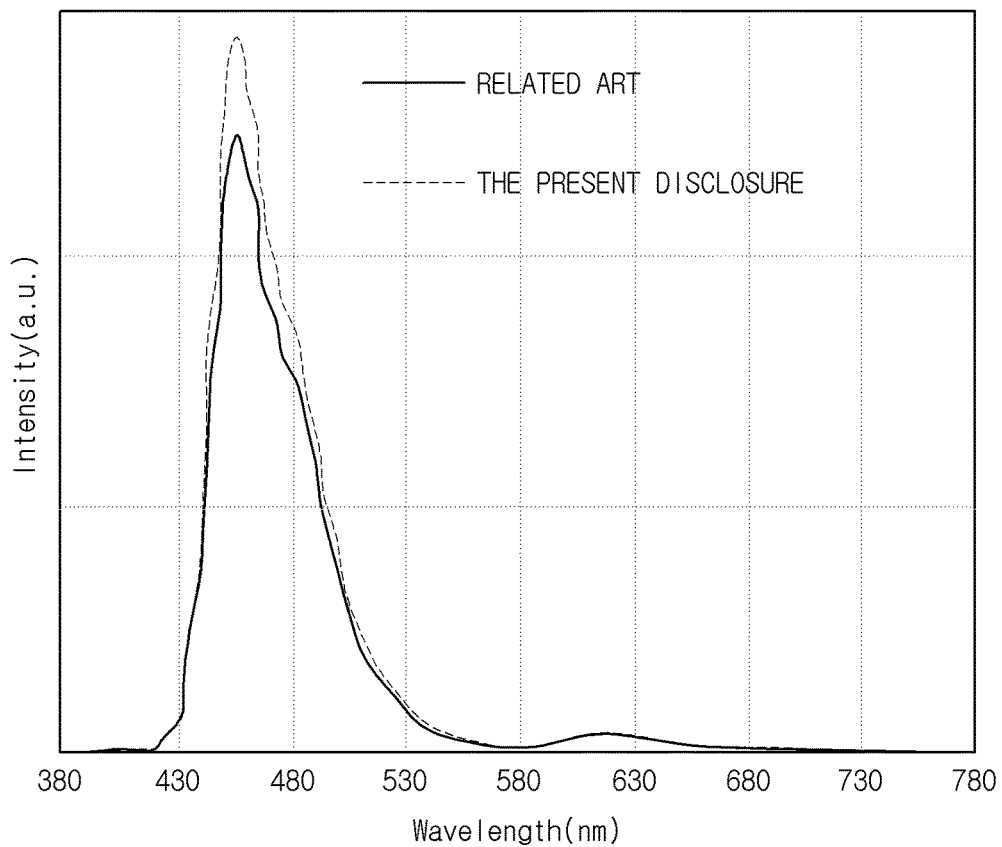
FIG. 4 is a data sheet illustrating spectrum characteristics of organic light emitting elements according to the related art and the present disclosure.
Figure 5:
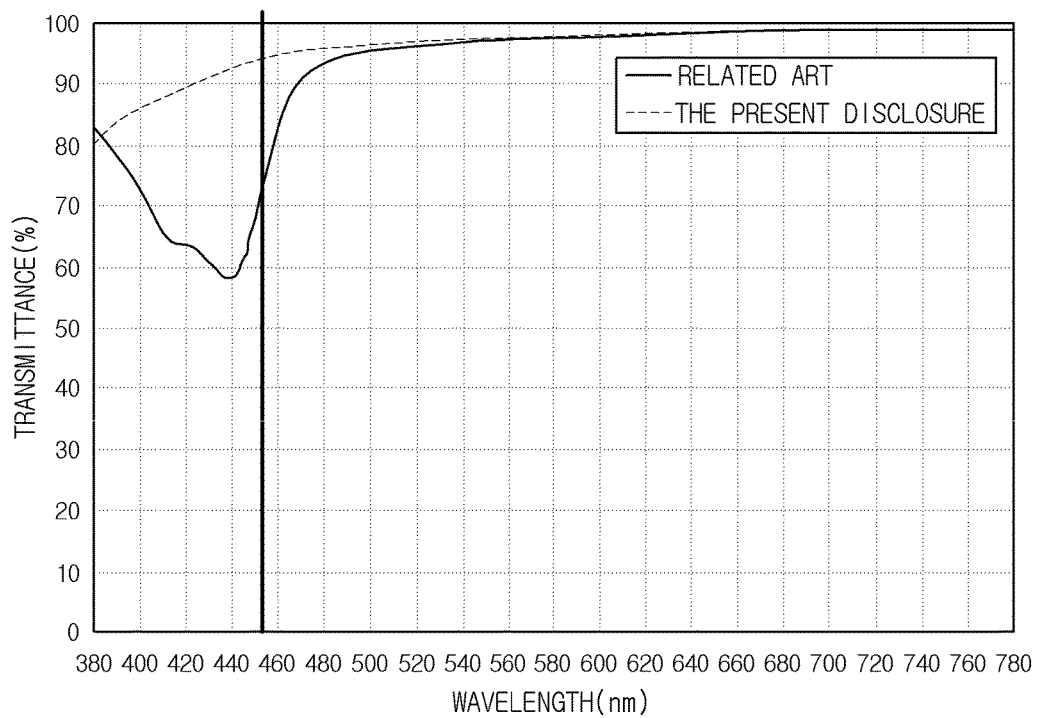
FIG. 5 is a data sheet illustrating transmittance of a first light emission layer for light emitted from a second light emission layer.

FIGS. 4 and 5 represent experimental results for effects of the organic light emitting elements according to the related art and the present disclosure.

In order to obtain the experimental results of FIGS. 4 and 5, the organic light emitting elements according to the related art and the present disclosure each having the stack structure of first and second light emission layers are used in the experiment. In this case, light generated in the second light emission layer is radiated through the first light emission layer. The organic light emitting element of the related art includes a first light emission layer which has a host with a band gap of not less than 2.70 eV but no more than 2.76 eV. Meanwhile, the organic light emitting element of the present disclosure includes a first light emission layer which has a host with a band gap of no more than 2.70 eV and not less than 2.76 eV.

FIG. 4 is a data sheet illustrating spectrum characteristics of organic light emitting elements according to the related art and the present disclosure. In other words, FIG. 4 represents intensities of lights of the organic light emitting elements according to the related are and the present disclosure with respect to wavelength of light. A wavelength band of 430 nm~480 nm in which a large peak is formed corresponds to a luminous domain of the second light emission layer. Also, another wavelength band of 580 nm~680 nm in which a small peak is formed corresponds to a luminous domain of the first light emission layer. As seen from the luminous domain of the second light emission layer, it is evident that the organic light emitting element of the present disclosure becomes larger than that of the related art in the intensity of light corresponding to the same color coordinates. This can be explained in detail through Table 1.

TABLE 1

|  | Driving voltage (V) | Current efficiency (cd/A) | Luminous efficiency (EQE) |
| --- | --- | --- | --- |
| Related art | 1.00 | 1.00 | 1.00 |
| Present disclosure | 0.98 | 1.06 | 1.08 |

Referring to Table 1, when characteristic factors regarding light emitted from the organic light emitting element are normalized to 1.00, respectively, it is evident that the organic light emitting element of the present disclosure enables not only current efficiency to increase but also luminous efficiency to increase. In other words, the organic light emitting element of the present disclosure entirely enhances the current efficiency and the luminous efficiency. Subsequently, characteristics regarding light of the second light emission layer which is radiates through the first light emission layer and corresponds to the luminous domain of the second light emission layer will be described.

FIG. 5 is a data sheet illustrating transmittance of a first light emission layer for light emitted from a second light emission layer. As shown in FIG. 4, light emitted from the second light emission layer forms a peak in the wavelength band of 430 nm~480 nm. However, light radiated from the second light emission layer through the first light emission layer decreases in intensity by below 20%. A maximum peak corresponds to a wavelength value when the intensity of light becomes a maximum value in the spectrum which illustrates the intensity of light with respect to the wavelength of light.

Referring to FIG. 5, the transmittance of the first light emission layer according to the related art in the luminous domain which including the light peak of the second light emission layer becomes about 76.97%. In other words, light of about 23.03% emitted from the second light emission layer is absorbed by the first light emission layer, and only light of 76.97% emitted from the second light emission layer penetrates through the first light emission layer.

Meanwhile, the transmittance of the first light emission layer according to the present disclosure in the luminous domain which including the light peak of the second light emission layer becomes about 94.32%. In other words, only light of 5.68% emitted from the second light emission layer is absorbed by the first light emission layer. As such, light of 94.32% emitted from the second light emission layer can penetrate through the first light emission layer.

TABLE 2

|  | CIEx | CIEy | Current efficiency (cd/A) | Luminous efficiency (EQE) |
| --- | --- | --- | --- | --- |
| Related art | 1.00 | 1.00 | 1.00 | 1.00 |
| The present disclosure | 1.00 | 1.00 | 1.14 | 1.14 |

Referring to Table 2, when characteristic factors regarding light emitted from the organic light emitting element are normalized to 1.00, respectively, the organic light emitting element of the present disclosure enables not only the current efficiency of the second light emission layer to increase but also the luminous efficiency of the second light emission layer to increase. In other words, it is evident that the second light emission layer of the organic light emitting element according to the present disclosure entirely provides a higher current efficiency and a higher luminous efficiency higher compared to that of the related.

In this manner, the organic light emitting element according to the present disclosure allows at least two light emission layers to be included into a single stack. As such, the organic light emitting element can reduce the driving voltage.

Also, the organic light emitting element improves the host of the first light emission layer. In accordance therewith, the current efficiency and the luminous efficiency of the second light emission layer can be enhanced. Moreover, the current efficiency and the luminous efficiency of the organic light emitting element can be enhanced.

Although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents without being limited to the detailed description.

What is claimed is:

1. An organic light emitting element comprising:
an anode and a cathode formed on a substrate and disposed to face each other; and
a stack formed between the anode and the cathode and configured to include a hole transport layer, a first light emission layer, a second light emission layer and an electron transport layer,
wherein the first light emission layer adjacent to the anode includes a host material with a band gap of between 1.00 eV and 2.70 eV or between 2.76 eV and 4.00 eV,
wherein the host material of the first light emission layer absorbs less than 20% of light generated in the second emission layer, and
wherein transmittance of the first light emission layer including light emitted from the second light emission layer is more than about 94%.

2. The organic light emitting element of claim 1, wherein a maximum intensity peak of light emitted from the second light emission layer through the first light emission layer decreases by less than 20%.

3. The organic light emitting element of claim 1, further comprising a light emission control layer formed between the first and second light emission layers.

4. The organic light emitting element of claim 3, wherein the light emission control layer is configured to transport electric-holes to the second light emission layer.

5. The organic light emitting element of claim 1, wherein the first light emission layer is a phosphorescent light emission layer and the second light emission layer is a fluorescent light emission layer.

6. An organic light emitting element comprising:
an anode and a cathode formed on a substrate and disposed to face each other;
a plurality of stacks formed between the anode and the cathode; and
charge generation layers formed between the plurality of stacks,
wherein each of the charge generation layers is formed in a junction structure including a plurality of organic layers formed by doping dopants,
wherein at least one of the stacks is configured to include a hole transport layer, a first light emission layer, a second light emission layer and an electron transport layer, and the first light emission layer adjacent to the anode includes a host material with a band gap of between 1.00 eV and 2.70 eV or between 2.76 eV and 4.00 eV,
wherein the host material of the first light emission layer absorbs only less than 20% of light generated in the second emission layer, and
wherein transmittance of the first light emission layer including light emitted from the second light emission layer is more than about 94%.

7. The organic light emitting element of claim 6, wherein a maximum intensity peak of light emitted from the second light emission layer through the first light emission layer decreases by less than 20%.

8. The organic light emitting element of claim 6, further comprising a light emission control layer formed between the first and second light emission layers.

9. The organic light emitting element of claim 8, wherein the light emission control layer is configured to transport electric-holes to the second light emission layer.

10. The organic light emitting element of claim 6, wherein the first light emission layer is a phosphorescent light emission layer and the second light emission layer is a fluorescent light emission layer.

11. The organic light emitting element of claim 10, wherein the first light emission layer is a red phosphorescent light emission layer and the second light emission layer is a blue fluorescent light emission layer.

* * * * *